United States Patent [19]

Wiegel

[11] Patent Number: 4,609,906
[45] Date of Patent: Sep. 2, 1986

[54] DIGITAL-TO-ANALOG/ANALOG-TO-DIGITAL DUAL MODE CIRCUIT

[75] Inventor: Roger E. Wiegel, Toddville, Iowa

[73] Assignee: Rockwell International Corporation, El Segundo, Calif.

[21] Appl. No.: 526,859

[22] Filed: Aug. 26, 1983

[51] Int. Cl.⁴ ............................................. H03K 13/02
[52] U.S. Cl. ......................... 340/347 C; 340/347 AD; 340/347 DA
[58] Field of Search ................. 340/347 AD, 347 DA, 340/347 C

[56]  References Cited

U.S. PATENT DOCUMENTS 3,906,488  9/1975  Suarez-Gartner ........... 340/347 DA
4,348,768  9/1982  Svala ........................... 340/347 DA

OTHER PUBLICATIONS

"Generate Four Outputs Sequentially with One DAC-/ADC Circuit"; *Electronic Design News*, Aug. 18, 1982, pp. 133–134.

*Primary Examiner*—Clifford C. Shaw
*Attorney, Agent, or Firm*—Robert C. Mayes; George A. Montanye; H. Fredrick Hamann

[57]   ABSTRACT

A circuit operable in two modes alternatively to provide a digital-to-analog converter capability and an analog-to-digital converter capability is disclosed utilizing a single digital multiplexer at a digital input and two analog multiplexers to control signal path routing. A track-and-hold circuit is utilized in the analog-to-digital configuration as a sample-and-hold, and alternatively in the digital-to-analog configuration as an operational amplifier.

1 Claim, 1 Drawing Figure

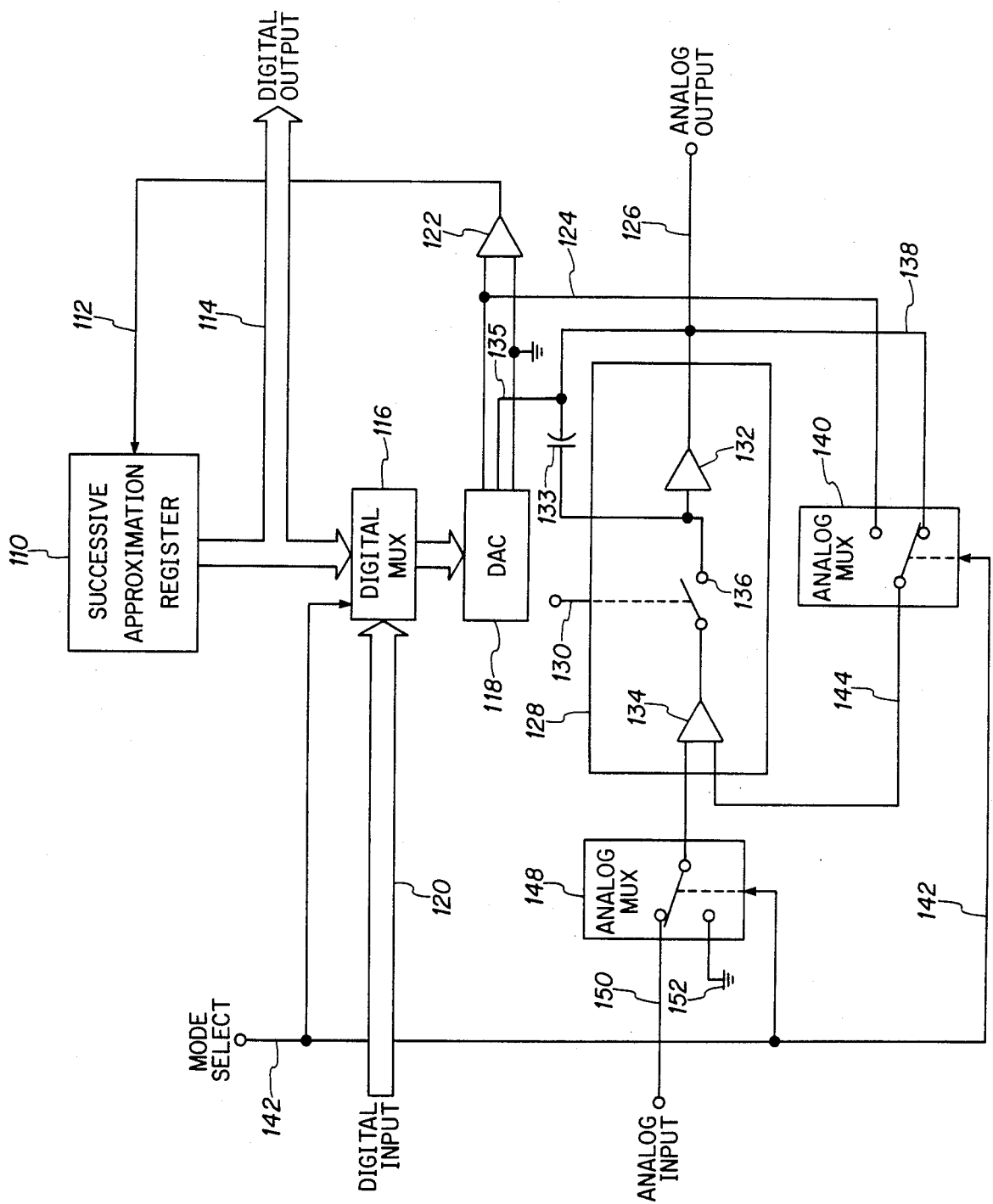

DIGITAL-TO-ANALOG/ANALOG-TO-DIGITAL DUAL MODE CIRCUIT

BACKGROUND OF THE INVENTION

This invention relates to electronics in general and more particularly to digital-to-analog and analog-to-digital conversion circuits.

The increasing application of digital electronics in a wide variety of real-world applications has broadened the necessity for analog-to-digital converters and digital-to-analog converters to provide a variety of interfacing capabilities to the electronics designer.

In microprocessor controlled industrial applications, for example, it is often necessary to convert a sensed analog signal into a digital format for computation and for storage in random access memory. Subsequent to digital operation on the digitally-formatted signal, an analog output to a meter or analog actuator is required and thus a digital-to-analog conversion capability is also necessary.

Normally, the implementation of this type of circuit requires a dedicated analog-to-digital (A/D) converter to receive inputs and re-format the input signal into a digital configuration for the processor. Additionally, a dedicated digital-to-analog circuit (DAC) to convert from the digital format back into an analog value is also required.

A significant design problem encountered in virtually every electronics system design is the requirement to reduce the parts count when possible without degrading performance, and thereby reduce cost, power consumption, and circuit board area required for a specific circuit function.

SUMMARY OF THE INVENTION

Accordingly, it is an object of the present invention to provide a circuit operable in a first mode to provide an analog-to-digital conversion capability, and in a second mode to provide a digital-to-analog conversion capability utilizing common circuit components in both modes of operation.

Another object of the present invention is to provide an apparatus capable of converting analog signals into a digital format in a first mode and converting digital signals into an analog format in a second mode of operation, and requiring reduced printed circuit board area and having a reduced parts count.

Briefly, and in accordance with the present invention, a circuit for converting input signals from an analog representation to a digital representation in a first mode of operation and alternatively converting input signals from a digital representation to an analog representation in a second mode of operation, is disclosed comprising a sample-and-hold circuit operable in the first mode to sample and maintain a selected analog value, and in the second mode as an operational amplifier.

The circuit has a digital input bus and digital output bus, as well as an analog input and output. In operation, either the digital input and analog output, or the analog input and digital output, are in operation at any given time. The non-active input and output in a given mode of operation are prevented from affecting circuitry also connected to the bus or line, and do not interfere with operation of the circuit when the opposite mode of operation is selected.

BRIEF DESCRIPTION OF THE DRAWING

The FIGURE is a schematic circuit diagram of one embodiment of the present invention having a mode select capability to operate either as a DAC or as an A/D converter.

DETAILED DESCRIPTION OF THE DRAWING

For purposes of clarity in the detailed description of the FIGURE, the circuitry will first be described in a digital-to-analog configuration with respect to the components and their method of operation, and thereafter will be similarly described in an analog-to-digital converter configuration.

In the digital-to-analog converter mode, the digital input bus 120 provides an input into digital multiplexer (MUX) 116. Digital multiplexer 116 has a mode select connection line 142 enabling the multiplexer 116 to receive a digital input from bus 120 or from the successive approximation register 110. In the DAC mode of operation, the received signal from digital input bus 120 is transferred to the digital-to-analog converter 118 having an output to reference ground and to line 124 providing an input to comparator 122 and to the analog multiplexer 140. The analog multiplexer 140 provides an analog signal path into the sample-and-hold circuitry displayed in box 128. Operational amplifier 134 receives the analog signal provided from connection 124 through the analog MUX 140 (when connected in the DAC mode) on line 144 as well as receiving a reference ground signal 152 from the analog multiplexer 148 (also in the DAC mode). The buffered signal is routed through the track-and-hold switch 136, normally closed during DAC mode operation (a Harris HA2420 integrated circuit in this example), through buffer amp 132 and is returned to the DAC 118 via a "span" input at 135, thereby forming an analog output voltage 126 representative of the applied digital input 120. The circuitry including op amp 134, switch 136, buffer amp 132, and capacitor 133 all operate essentially as an operational amplifier providing an analog output signal on line 126.

The mode select line 142 provides the capability of switching digital MUX 116, analog MUX 140, and analog MUX 148 from the digital-to-analog configuration previously described, to the analog-to-digital configuration as is shown in the figure and is directly connected to both analog multiplexers 140, 148 and the digital mux 116. Further, the mode select operates indirectly on and through 11 to force switch 136 to be closed (track mode) during the DAC mode of operation.

When mode select line 142 operates to select the analog-to-digital mode by directly switching the three multiplexers, the analog input line 150 provides an analog input to the circuitry contained in box 128 which is operable by the proper application of signals to line 130 operating switch 136, as a sample-and-hold circuit. Op amp 134 provides a feedback comparison signal into switch 136 and when switch 136 is closed, into capacitor 133 and buffer amp 132. The common node output connecting the circuit analog output line 136 with the output of buffer amp 132, capacitor 133 and line 138 into analog MUX 140 provides the input to DAC 118 on line 135 coupled to the "span" input of DAC 118.

The interconnecton of the digital-to-analog converter, an Analog Devices AD565 in this example, is well know in the art and utilization of the span connection (pin 10 of the 565 device) enables the digital-toanalog converter to receive the analog input readily, provide the analog output to comparator 122, and thereafter to the successive approximation register 110 (an AM2704 as constructed in this embodiment). In this manner, the digital output is provided on digital bus 114 after the appropriate timing intervals required by the successive approximation register 110 and other normal delays inherent in the circuitry.

The track-and-hold circuitry is maintained as an operational amplifier during digital-to-analog conversions by maintaining switch 136 in the closed position at all times. When in the analog-to-digital configuration, a signal on line 130 opening switch 136 enables the potential stored on capacitor 133 to be successively approximated as is known in the art through the use of the circuitry as shown and described herein to provide a digital output on bus 114.

While this invention has been described with reference to various illustrative embodiments, it is not intended that this description be construed in a limiting sense. Various modifications of the illustrative emoodiments, as well as other embodiments of the invention, will be apparent to persons skilled in the art upon reference to this description. It is therefore contemplated that the appended claim will cover any such modifications of embodiments as fall within the true scope of the invention.

I claim:

1. A circuit for selectively converting input signals, in a first mode of operation, from an analog representation to a digital representation, and alternatively converting input signals from a digital representation to an analog representation in a second mode of operation, comprising in combination:
    a. a digital multiplexer having two digital inputs, a control input to select one of said digital inputs and a digital output;
    b. a digital-to-analog converter coupled to said digital output of said digital multiplexer, and having a feedback loop;
    c. a first analog multiplexer (140) having an output (144), a first analog input coupled to said digital-to-analog converter and a second analog input (138) and a control input for selecting between said first and second analog inputs;
    d. a sample-and-hold circuit (128) coupled to said output of said first analog multiplexer (144) and to said second analog input (138) and operable in said second mode as an operational amplifier;
    e. a second analog multiplexer (148) having an output coupled to said sample-and-hold circuit and a plurality of analog inputs, said analog inputs including a signal ground input (152) and a control input for selecting between said plurality of analog inputs; and
    f. a single mode select line for alternatively selecting said digital-to-analog mode, or said analog-to-digital mode, of operation, and coupled to said control input of said digital multiplexer, said control input of said first analog multiplexer, and said control input of said second analog multiplexer, respectively.

* * * * *